United States Patent
Park et al.

(10) Patent No.: US 12,419,133 B2
(45) Date of Patent: Sep. 16, 2025

(54) SILICON PHOTODETECTOR USING RANDOMLY ARRANGED METAL NANOPARTICLES AND METHOD FOR MANUFACTURING SAME

(71) Applicant: KOREA ADVANCED INSTITUTE OF SCIENCE AND TECHNOLOGY, Daejeon (KR)

(72) Inventors: Jongcheol Park, Daejeon (KR); Gapseop Sim, Seoul (KR); Tae Hyun Kim, Daejeon (KR); Jong-Kwon Lee, Cheongju-si (KR); Il-Suk Kang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 497 days.

(21) Appl. No.: 18/153,919

(22) Filed: Jan. 12, 2023

(65) Prior Publication Data
US 2023/0155042 A1    May 18, 2023

Related U.S. Application Data

(63) Continuation of application No. PCT/KR2020/016586, filed on Nov. 23, 2020.

(30) Foreign Application Priority Data

Sep. 24, 2020 (KR) .................. 10-2020-0123444

(51) Int. Cl.
 *H10F 77/122* (2025.01)
 *B82Y 40/00* (2011.01)
(Continued)

(52) U.S. Cl.
 CPC ............ *H10F 77/122* (2025.01); *B82Y 40/00* (2013.01); *H10F 30/223* (2025.01); *H10F 71/00* (2025.01);
(Continued)

(58) Field of Classification Search
 CPC .... H10F 71/121; H10F 77/306; H10F 30/221; H10F 77/70
 See application file for complete search history.

(56) References Cited

U.S. PATENT DOCUMENTS 8,148,762 B2    4/2012  Joe et al.
8,314,935 B2 *  11/2012 Handa .................. G01N 21/554
                                                     356/322
(Continued)

FOREIGN PATENT DOCUMENTS

DE    102012216903    *   3/2014
JP    2014-072219 A       4/2014
(Continued)

*Primary Examiner* — Matthew L Reames
(74) *Attorney, Agent, or Firm* — Central California IP Group, P.C.; Andrew D. Fortney

(57) ABSTRACT

A silicon photodiode according to an embodiment of the present invention comprises: a silicon substrate having a first conductive area and a second conductive area horizontally spaced apart from the first conductive area; a plurality of randomly arranged metal nanoparticles formed on the silicon substrate; an antireflective layer covering the metal nanoparticles; a first contact passing through the antireflective layer and connected to the first conductive layer; and a second contact passing through the antireflective layer and connected to the second conductive layer.

11 Claims, 10 Drawing Sheets

(51) Int. Cl.
  *H10F 30/223*  (2025.01)
  *H10F 71/00*  (2025.01)
  *H10F 77/00*  (2025.01)
  *H10F 77/30*  (2025.01)

(52) U.S. Cl.
  CPC ......... *H10F 71/121* (2025.01); *H10F 77/306* (2025.01); *H10F 77/933* (2025.01)

(56) References Cited

U.S. PATENT DOCUMENTS

| | | |
|---|---|---|
| 8,325,262 B2 | 12/2012 | Choi |
| 2009/0141159 A1 | 6/2009 | Choi |
| 2009/0146198 A1 | 6/2009 | Joe et al. |
| 2013/0240010 A1 | 9/2013 | Kim |
| 2016/0071997 A1* | 3/2016 | Kundalgurki ........... H10F 30/29 257/428 |
| 2017/0025452 A1 | 1/2017 | Sekisawa et al. |

FOREIGN PATENT DOCUMENTS

| | | | |
|---|---|---|---|
| KR | 10-2008-039656 B1 | | 6/2008 |
| KR | 10-2009-0057786 A | | 6/2009 |
| KR | 10-2009-0061303 A | | 6/2009 |
| KR | 20110068161 | * | 6/2011 |
| KR | 10-2013-0104347 A | | 9/2013 |
| KR | 10-2017-0033951 A | | 3/2017 |
| KR | 10-2020-0078790 A | | 7/2020 |

* cited by examiner

SILICON PHOTODETECTOR USING RANDOMLY ARRANGED METAL NANOPARTICLES AND METHOD FOR MANUFACTURING SAME

CROSS-REFERENCE TO RELATED APPLICATIONS

This application is a continuation of and claims priority to PCT/KR2020/016586 filed on Nov. 23, 2020, which claims priority to Korea Patent Application No. 10-2020-0123444 filed on Sep. 24, 2020, the entireties of which are both hereby incorporated by reference.

TECHNICAL FIELD

The present disclosure relates to a silicon photodetector, and more particular to, a silicon photodetector having random arrangement and particle size distribution.

BACKGROUND

A silicon photodetector or a photodiode is a representative semiconductor sensor and is a type of photosensor converting light energy into an electrical signal. A silicon photodetector is a device using a photovoltaic effect of a semiconductor PN junction portion, and is used to detect visible light, infrared ray, ultraviolet ray, and X-ray or widely applied as an image sensor using an array form, or the like.

Performance of a silicon photodetector includes responsivity at an operating wavelength, response speed, low noise characteristics, and the like. Especially, sensitivity is determined by photocurrent between two electrodes. A main factor determining the responsivity is quantum efficiency, and research into improvement of quantum efficiency has been conducted.

Silicon is an indirect bandgap material and requires help of photons to generate carriers. Surface plasmon resonance is a physical phenomenon in which resonant oscillation of conduction electrons occurs at an interface between positive and negative permittivity materials. Plasmon resonance using periodic nanopatterns may be used to increase excitation efficiency of a photodiode.

A periodic metal pattern for plasmon resonance exhibits an effect of excitation efficiency only at a specific resonance wavelength. A resonance wavelength depends on a period and a shape of metal patterns. Accordingly, there is a need for a novel method of increasing excitation efficiency in a broad wavelength band.

SUMMARY

An aspect of the present disclosure is to provide a photodiode increasing excitation efficiency in a predetermined wavelength band using a plurality of randomly arranged nanoparticles.

A silicon photodiode according to an example embodiment includes: a silicon substrate having a first conductive region and a second conductive region disposed to be horizontally spaced apart from the first conductive region; a plurality of randomly arranged metal nanoparticles formed on the silicon substrate; an antireflective layer covering the metal nanoparticles; a first contact penetrating through the antireflective layer to be connected to the first conductive region; and a second contact penetrating through the antireflective layer to be connected to the second conductive region.

In an example embodiment, the metal nanoparticles may be gold or silver nanoparticles, the metal nanoparticles may hemispherical, diameters of the metal nanoparticles may be distributed within a range of 100 nm to 200 nm, and a fill factor of the metal nanoparticles may be 15% to 25%.

In an example embodiment, the metal nanoparticles may be gold or silver nanoparticles, the metal nanoparticles may be hemispherical, diameters of the metal nanoparticles may be distributed within a range of 200 nm to 400 nm, and a fill factor of the metal nanoparticles may be 15% to 25%.

In an example embodiment, the first conductive region and the second conductive region may be formed to be in contact with one surface of the semiconductor substrate, and the silicon photodiode may further include an intrinsic region disposed between the first conductive region and the second conductive region.

A method for manufacturing a silicon photodiode according to an example embodiment includes: forming a buffer layer on a silicon substrate; forming a first photoresist pattern on the silicon substrate on which the buffer layer is formed, and then implanting impurities of a first conductivity type to form a first conductive region; forming a second photoresist pattern to be spaced apart from the first conductive region on the silicon substrate, on which the buffer layer is formed, and the implanting impurities of a second conductivity type to form a second conductive region; removing the buffer layer from the silicon substrate, on which the first conductive region and the second conductive region are formed, with a hydrophobic solution; depositing an island-shaped metal layer on the silicon substrate from which the buffer layer is removed; thermally treating the silicon substrate, on which the metal layer is deposited, to convert the metal layer into metal nanoparticles; forming an antireflective layer on the silicon substrate to cover the metal nanoparticles; and forming a first contact, penetrating through the antireflective layer to be connected to the first conductive region, and a second contact penetrating through the antireflective layer to be connected to the second conductive region.

In an example embodiment, the thermal treatment may be performed in vacuum or $N_2$ atmosphere at temperature lower than or equal to a melting point of the metal layer, the thermal treatment may have a low melting point due to characteristics of an island-shaped metal layer, and the thermal treatment may be performed at temperature T within a range of 100 degrees Celsius (Tc-100), equal to or less than a melting temperature Tc of the metal layer, to the melting temperature Tc.

In an example embodiment, the thermal treatment may be performed at a temperature of 900 degrees Celsius for several minutes to several tens of minutes when the metal layer includes silver.

In an example embodiment, the metal layer may be deposited using a sputtering method, the metal layer may have a thickness of several nanometers to several tens of nanometers, and the metal layer may be deposited to have an island shape.

In an example embodiment, the metal nanoparticles may be gold or silver nanoparticles, the metal nanoparticles may be hemispherical, diameters of the metal nanoparticles may be distributed within a range of 100 nm to 200 nm, and a fill factor of the metal nanoparticles may be 15% to 25%.

In an example embodiment, the metal nanoparticles may be gold or silver nanoparticles, the metal nanoparticles may be hemispherical, diameters of the metal nanoparticles may be distributed within a range of 200 nm to 400 nm, and a fill factor of the metal nanoparticles may be 15% to 25%.

A silicon photodiode according to an example embodiment include: a silicon substrate having a first conductive region and a second conductive region disposed to be vertically spaced apart from the first conductive region; a plurality of metal nanoparticles formed on the silicon substrate and arranged randomly on the first conductive region; an antireflective layer covering the metal nanoparticles; a first contact penetrating through the antireflective layer to be connected to the first conductive region; and a second contact connected to the second conductive region.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
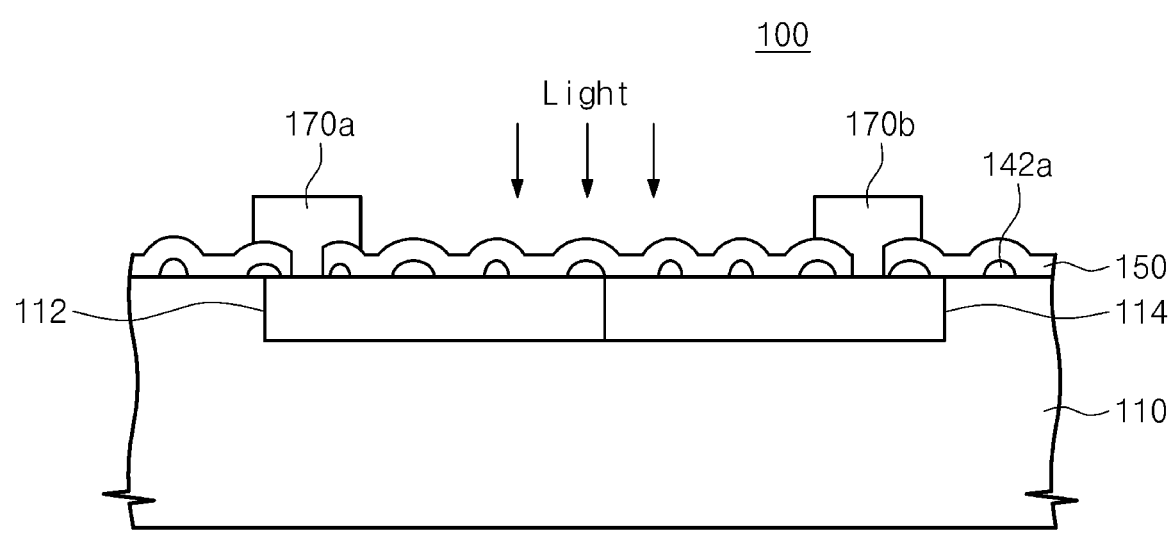
FIG. 1 is a conceptual diagram illustrating a silicon photodiode according to an embodiment of the present disclosure.

A metal nanoparticle process according to an example embodiment may utilize island growth (or Volmer-Weber growth) found during formation of a semiconductor thin film, and may generate metal nanoparticles through a thermal treatment on an islanded metal thin film. Sizes of the metal nanoparticles may have a uniform Gaussian-like distribution, an average particle size may be 150 nm, and a particle size may range from 100 nanometers (nm) to 400 nm.

According to the present disclosure, metal nanoparticles may be formed to have a size of tens to hundreds of nanometers without a solution process using an additional dispersant.

When a solution process using a dispersant is performed to form metal nanoparticles, nanoparticles desorbed from a substrate may contaminate a process chamber to prevent subsequent processes from being performed. However, the present disclosure uses a vacuum deposition process and a heat treatment process to facilitate subsequent processes such as a process of an antireflective layer.

In the present disclosure, metal nanoparticles may be formed on a large-area substrate through semiconductor processes according to the related art such as a thin film deposition process and a heat treatment process, and thus subsequent processes including an antireflective layer process, or the like, may be easily performed on the metal nanoparticles.

According to the present disclosure, responsivity at a specific wavelength band may be improved as compared with a photodetector according to the related art. Selection of the specific wavelength band may be controlled using a thickness or a fill factor of a metal film for forming nanoparticles.

According to the present disclosure, photodetection efficiency for a broad wavelength band may be improved using metal nanoparticles having random arrangement and a predetermined particle size distribution based on a principle, similar to a principle of a plasmonic resonator.

According to the present disclosure, when silver (Ag) and gold (Au) thin films having several nanometers are deposited on a surface of a hydrophobic silicon substrate, a coral-shaped metal island structure may be formed. When a vacuum heat treatment is then performed, the metal island structure may be melted to be formed on a surface of the silicon substrate due to wetting characteristics to be converted into a randomly arranged metal nanoparticle structure. The silicon substrate including the metal nanoparticle structure may be subjected to a subsequent process such as a process of an antireflective layer or a protective layer.

According to an example embodiment, a process of an oxide layer process may be applied to an antireflective layer and a protective layer due to high process compatibility. A plasmonic structure may be directly applied to a depletion region of a photodiode to significantly improve an effect thereof. In addition, nanoparticles for the plasmonic structure may have random arrangement and a size within a predetermined range, so that efficiency at a single wavelength may be low but efficiency at a broad wavelength band may be improved, as compared with a structure having a predetermined size and regular arrangement according to the related art.

Hereinafter, embodiments of the present disclosure will be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present disclosure to those skilled in the art.

FIG. 1 is a conceptual diagram illustrating a silicon photodiode according to an embodiment of the present disclosure.

Referring to FIG. 1, a silicon photodiode 100 may include a silicon substrate 110 having a first conductive region 112 and a second conductive region 114 disposed to be horizontally spaced apart from the first conductive region 112, a plurality of randomly arranged metal nanoparticles 142a formed on the silicon substrate 110, an antireflective layer 150 covering the metal nanoparticles 142a, a first contact 170a penetrating through the antireflective layer 150 to be connected to the first conductive region 112, and a second contact 170b penetrating through the antireflective layer to be connected to the second conductive region 114.

The silicon substrate 110 may be a single-crystalline silicon substrate and may be doped with N-type impurities. The first conductive region 112 may be a P-type region, and the second conductive region 114 may be a n-type region. The photodiode 100 may have a lateral shape.

The metal nanoparticles 142a may be disposed on the first conductive region 112 and the second conductive region 114. An interface between the first conductive region 112 and the second conductive region 114 may form a depletion region by an external voltage. The metal nanoparticles 142a may be gold (Au) or silver (Ag) nanoparticles and may have a hemispherical shape. Each of the metal nanoparticles may have a diameter of 200 nm to 400 nm, and a fill factor of the metal nanoparticles may be 15% to 25%. An average diameter of the metal nanoparticles may be 300 nm. In this case, excitation efficiency may be increased in a band of 530 nm to 780 nm, as compared with the case in which the metal nanoparticles are absent. For example, excitation efficiency may be increased in a visible light band.

According to a modified embodiment, the diameters of the metal nanoparticles 142a may be distributed in a range of 100 to 200 nm, and the fill factor of the metal nanoparticles may be 15 to 25%. An average diameter of the metal nanoparticles may be 150 nm. In this case, excitation efficiency may be increased in a band of 480 to 670 nm, as compared with the case in which the metal nanoparticles are absent. A maximum absorption wavelength may be 540 nm. For example, the excitation efficiency may be increased in a green wavelength band.

Excitation efficiency, obtained by plasmon resonance, may depend on the average diameter and the fill factor of the metal nanoparticles. The diameter and the fill factor of the metal nanoparticles may depend on a material and a thickness of a metal layer having a metal island and a vacuum heat treatment process. In addition, the diameter and the fill factor of the metal nanoparticles may depend on hydrophobic characteristics of the metal layer and the silicon substrate.

The antireflective layer 150 may be formed using a multilayer structure. For example, the antireflective layer 150 may have a multilayer structure, in which SiO2 and MgF are alternatively stacked, or a multilayer structure in which SiN and MgF are alternately stacked. The antireflective layer may be formed by alternately stacking a high refractive index material and a low refractive index material in a visible light band or a green band.

The first contact 170a may be a metal electrode pad bonded to the first conductive region 112. The first contact 170a may be aluminum or gold.

The second contact 170b may be a metal electrode pad bonded to the second conductive region 114. The second contact 170b may be aluminum or gold.

FIGS. 2A to 2I are conceptual views illustrating a method of manufacturing a photodiode according to an example embodiment of the present invention.

Referring to FIGS. 2A to 2I, the method may include forming a buffer layer 122 on a silicon substrate 110, forming a first photoresist pattern 132 on the silicon substrate on which the buffer layer 122 is formed and then implanting impurities of a first conductivity type to form a first conductive region 112, forming a second photoresist pattern 134 to be spaced apart from the first conductive region 112 on the silicon substrate 110, on which the buffer layer 122 is formed, and the implanting impurities of a second conductivity type to form a second conductive region 114, removing the buffer layer 122 from the silicon substrate 110, on which the first conductive region 112 and the second conductive region 114 are formed, with a hydrophobic solution, depositing an island-shaped metal layer 142 on the silicon substrate from which the buffer layer 122 is removed, thermally treating the silicon substrate 110, on which the metal layer 142 is deposited, to convert the metal layer 142 into metal nanoparticles 142a, forming an antireflective layer 150 on the silicon substrate to cover the metal nanoparticles 142a; and forming a first contact 170a, penetrating through the antireflective layer to be connected to the first conductive region 112, and a second contact 170b penetrating through the antireflective layer to be connected to the second conductive region 114.

Figure 2A:
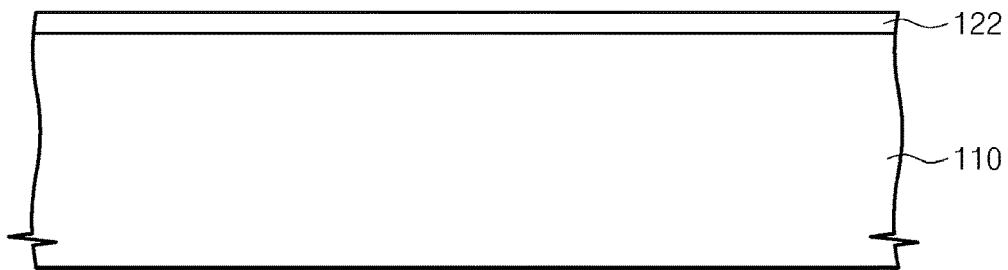
FIGS. 2A to 2I are conceptual diagrams illustrating a method for manufacturing a photodiode according to an embodiment of the present disclosure.

Referring to FIG. 2A, a buffer layer 122 may be formed on a silicon substrate 110. The buffer layer 122 may be a silicon oxide layer. The buffer layer 122 may have a thickness of several to several tens of nanometers. The buffer layer 122 may be formed by thermal oxidation or low pressure chemical vapor deposition. The buffer layer 122 may suppress damage to the silicon substrate 100 in an ion implantation process.

Figure 2B:
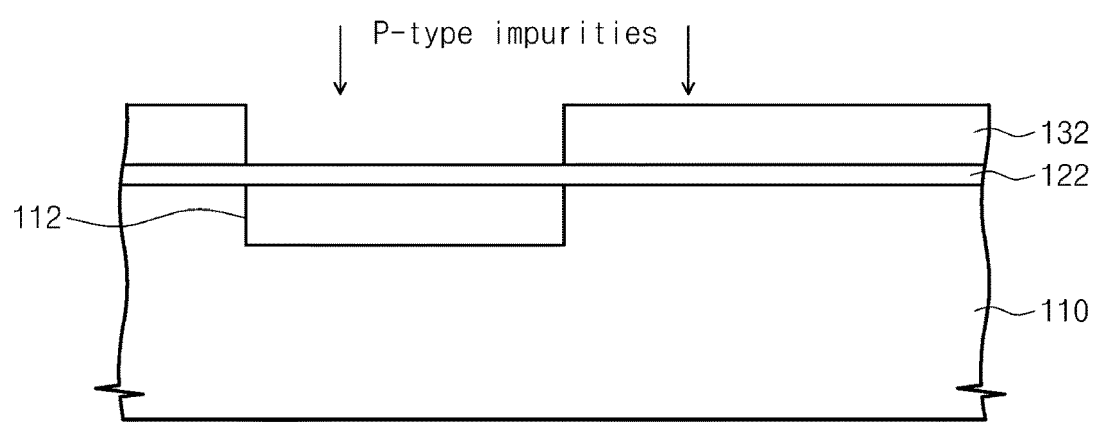

Referring to FIG. 2B, a first photoresist pattern 132 may be formed on the silicon substrate 110 on which the buffer layer 122 is formed, and then impurities of a first conductivity type may be implanted to form a first conductive region 112. The first conductivity type may be P-type. The P-type impurity may be boron. After the implantation of the impurities to form the first conductive region 112 is completed, the first photoresist pattern 132 may be removed.

Figure 2C:
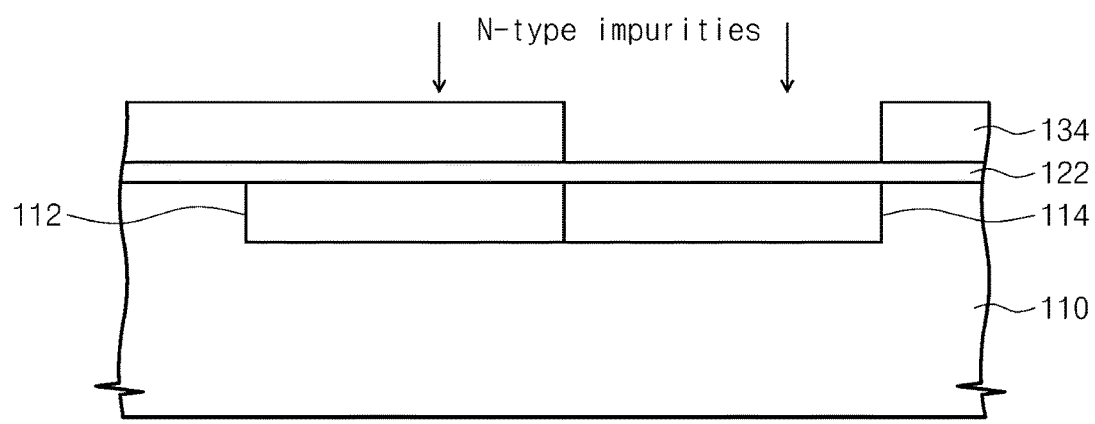

Referring to FIG. 2C, a second photoresist pattern 134 may be formed to be spaced apart from the first conductive region 112 on the silicon substrate 110 on which the buffer layer 122 is formed, and impurities of a second conductive type may then be implanted to form a second conductive region 114. After the implantation of the impurities to form the second conductive region 114 is completed, the second photoresist pattern 134 may be removed. When the silicon substrate 110 is doped with N-type impurities, the second conductive region 114 may not be separately formed and the silicon substrate 110 may serve as the second conductive region 114.

Figure 2D:
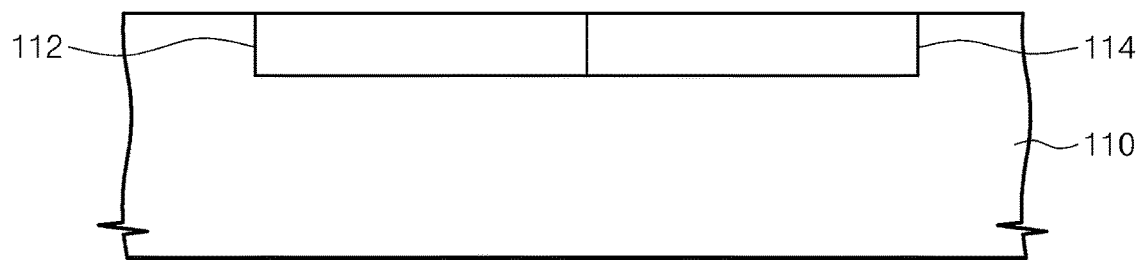

Referring to FIG. 2D, the buffer layer 122 may be removed from the silicon substrate 110, on which the first conductive region 112 and the second conductive region 114 are formed, with a hydrophobic solution. A pre-treatment process for securing hydrophobicity may be performed on a surface of the silicon substrate 110 to manufacture a metal nanoparticle structure. The pre-treatment process may remove the buffer layer 122 and a native oxide layer, and may provide hydrophobicity to the surface of the silicon substrate 110. The pre-treatment process may include a dilute HF (DHF) or buffered oxide etchant (BOE) cleaning process. After the pre-cleaning process, the surface of the silicon substrate may have hydrophobicity, but a contact angle may be gradually decreased with the lapse of time in an atmospheric environment. Therefore, an island-shaped metal layer may be deposited on the silicon substrate 110 without exposure to the atmosphere.

Figure 2E:
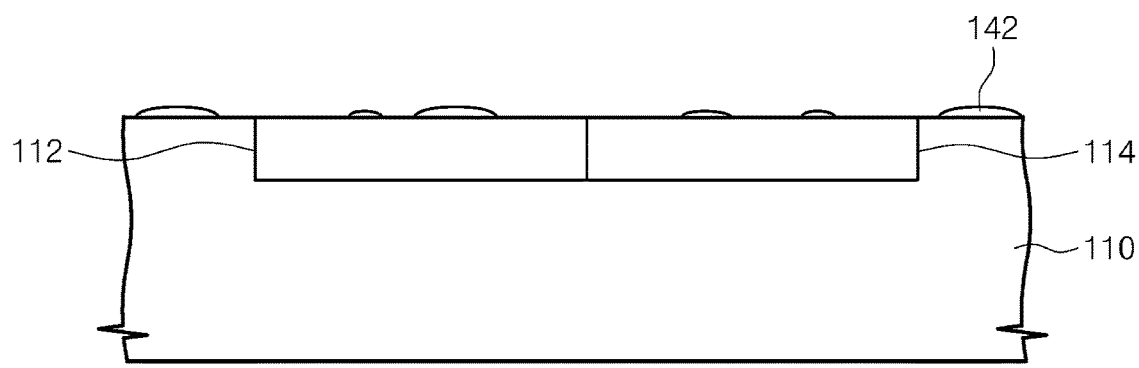

Referring to FIG. 2E, a metal film 142 having an island shape is deposited on the silicon substrate 110 from which the buffer layer 122 is removed. The metal layer may include gold (Au) or silver (Ag). The metal layer 142 may be deposited at room temperature using a sputtering process to have a target thickness of about 5 nm. Accordingly, the metal layer 142 may have Volmer-Weber growth or island growth on the silicon substrate 110. A shape of each island is not limited to a circular shape and may be an arbitrary closed curve shape. A fill factor of the metal layer 142 may be 25% to 35%. A contact angle of the metal layer 142 may be greater than 0 degree. The contact angle may be 90 degrees or less.

Figure 2F:
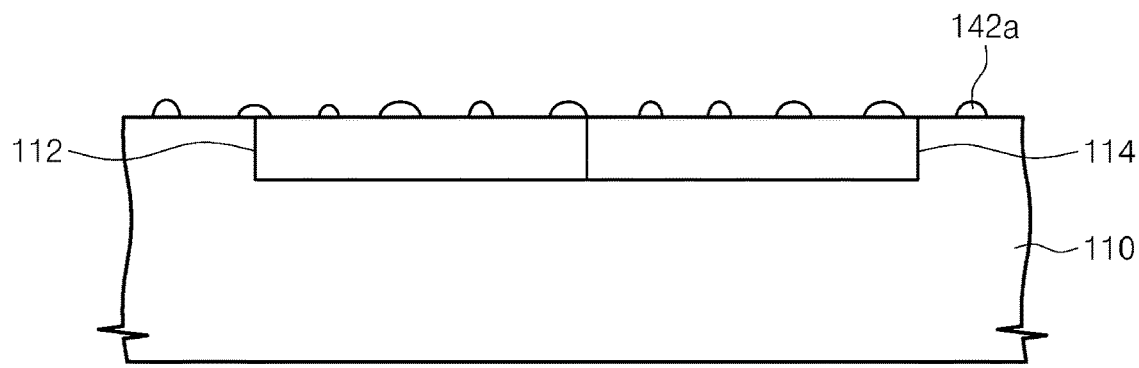

Referring to FIG. 2F, the silicon substrate 110, on which the metal film 142 is deposited, may be thermally treated to convert the metal layer 142 into metal nanoparticles 142a. The thermal treatment may be a metal reflow process. The thermal treatment may be performed in vacuum or $N_2$ atmosphere at a melting point or less to maintain the hydrophobicity of the silicon substrate. For example, in the case of the silver (Ag), a melting point may be 961 degrees Celsius and the process may be performed in a vacuum furnace at 900 degrees Celsius for 10 minutes. The thermal treatment temperature may be within a range of 100 degrees Celsius or less than the melting point to the melting point. Accordingly, due to the hydrophobic characteristics of the silicon substrate 110, the metal layer having an island structure may be converted to have a large contact angle, and a single island may be divided into a plurality of nanoparticles. Accordingly, the fill factor of the metal nanoparticles may be decreased as compared with the metal layer, the number of islands may be increased, and the contact angle may be increased as compared to the metal layer. The contact angle may be, in detail, 90 degrees to 110 degrees. Accordingly, the metal nanoparticle may have a hemispherical shape. The metal nanoparticles may have a distribution close to a Gaussian distribution. The metal nanoparticles may be gold or silver nanoparticles. Each of the metal nanoparticles may have a hemispherical shape and may have a diameter of 200 nm to 400 nm, and a fill factor of the metal nanoparticles may be 15% to 25%. An average diameter of the metal nanoparticles may be 300 nm. In this case, excitation efficiency may be increased in a band of 530 nm to 780 nm, as compared with the case in which the metal nanoparticles are absent. For example, the excitation efficiency may be increased in a visible light band.

The metal nanoparticles 142a may be gold or silver nanoparticles. Each of the metal nanoparticles may have a hemispherical shape and may have a diameter of 100 nm to 200 nm, and a fill factor of the metal nanoparticles may be 15% to 25%. An average diameter of the metal nanoparticles may be 150 nm. In this case, excitation efficiency may be increased in a band of 480 nm to 670 nm, as compared with the case in which the metal nanoparticles are absent. A maximum absorption wavelength may be 540 nm. For example, the excitation efficiency may be increased in a green wavelength band.

The thermal treatment may convert an island structure having poor particle uniformity into a particle structure having improved uniformity. While being melted by the thermal treatment, the metal layer may be formed on the silicon surface due to wetting characteristics to be converted into a randomly arranged nanoparticle structure.

Figure 2G:
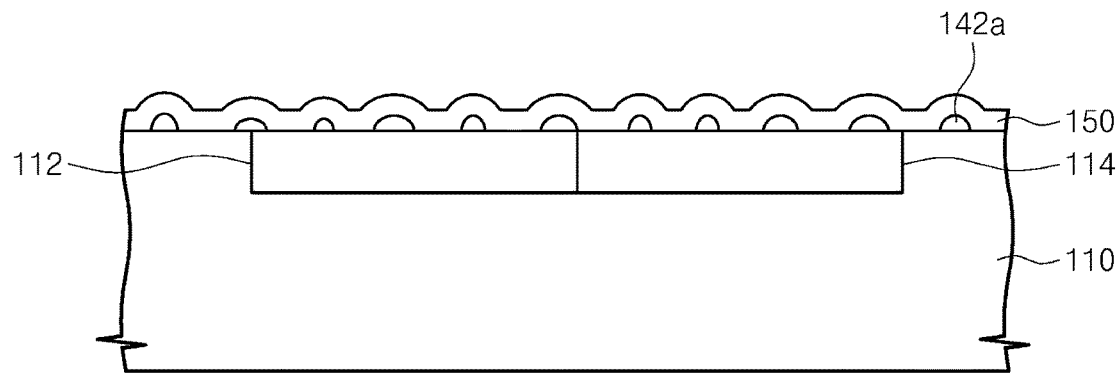

Referring to FIG. 2G, an antireflective layer 150 may be formed on the silicon substrate 110 to cover the metal nanoparticles 142a. The antireflective layer 150 may be manufactured using a multilayer structure. For example, the multilayer structure may be a multilayer structure, in which $SiO_2$ and MgF are alternately stacked, or a multilayer structure in which SIN and MgF are alternately stacked. The antireflective layer 150 may be formed by alternately stacking a high refractive index material and a low refractive index material in a visible light band or a green band.

Figure 2H:
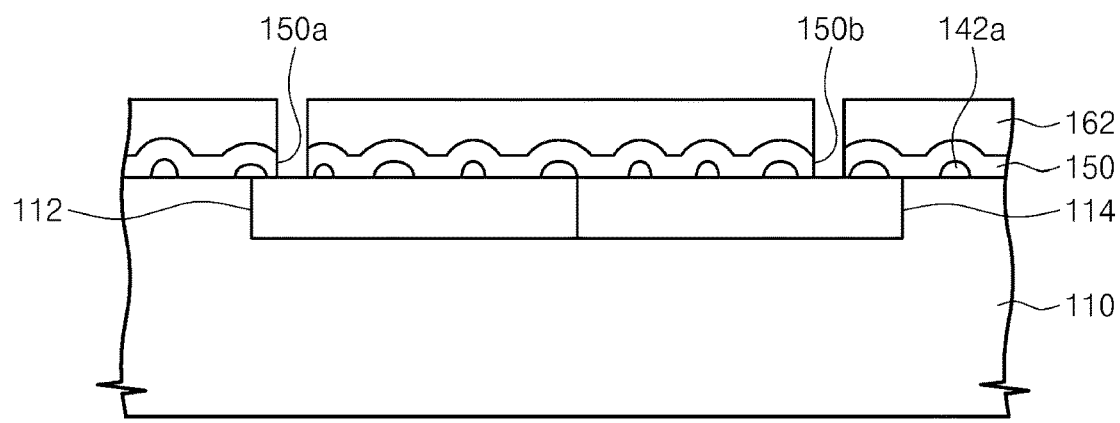
Figure 2I:
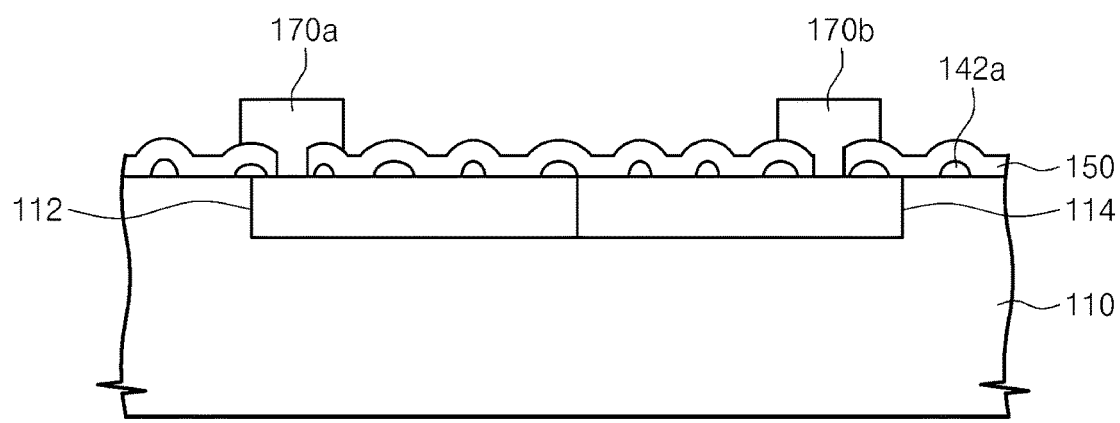

Referring to FIGS. 2H and 2I, a first contact 170a, penetrating through the antireflective layer 150 to be connected to the first conductive region 112, and a second contact 170b, penetrating through the antireflective layer 150 to be connected to the second conductive region 114, may be formed.

A third photoresist pattern 162 may be formed and the antireflective layer 150 may be etched using the third photoresist pattern 162 as an etch mask to form a first contact hole 150a and a second contact holes 150b. The third photoresist pattern 162 may be removed.

Then, the first contact 170a and the second contact 170b may be formed using a lift-off process. A fourth photoresist pattern, not illustrated, may be formed to expose the first contact hole 170a and the second contact hole 170b, and a conductive layer may be deposited to fill the first contact hole 150a and the second contact hole 150b. Then, the fourth photoresist pattern may be removed to form a first contact 170a and a second contact 170b. The first contact 170a may extend from the antireflective layer to serve as a wiring and an electrode. The second contact 170b may extend from the antireflective layer to serve as a wiring and an electrode.

Figure 3:
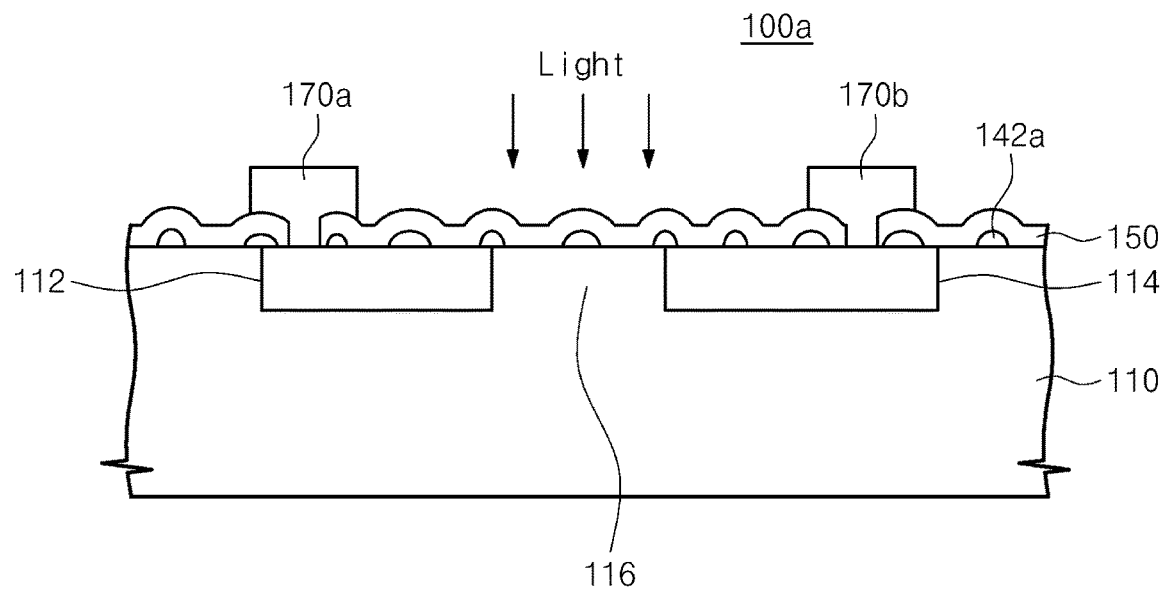
FIG. 3 is a conceptual diagram illustrating a silicon photodiode according to another embodiment of the present disclosure.

FIG. 3 is a conceptual diagram illustrating a silicon photodiode according to another embodiment of the present disclosure.

Referring to FIG. 3, a silicon photodiode 100a may include a silicon substrate 110 having a first conductive region 112 and a second conductive region 114 disposed to be horizontally spaced apart from the first conductive region 112, a plurality of randomly arranged metal nanoparticles 142a formed on the silicon substrate 110, an antireflective layer 150 covering the metal nanoparticles 142a, a first contact 170a penetrating through the antireflective layer 150 to be connected to the first conductive region 112, and a second contact 170b penetrating through the antireflective layer 150 to be connected to the second conductive region 114.

The first conductive region 112 and the second conductive region 114 may be formed to be in contact with one surface of the silicon substrate 110, and an intrinsic region 116 may be disposed between the first conductive region 112 and the second conductive region 112. The first conductive region 112 may be a P-type region, and the second conductive region 114 may be an N-type region.

Figure 4:
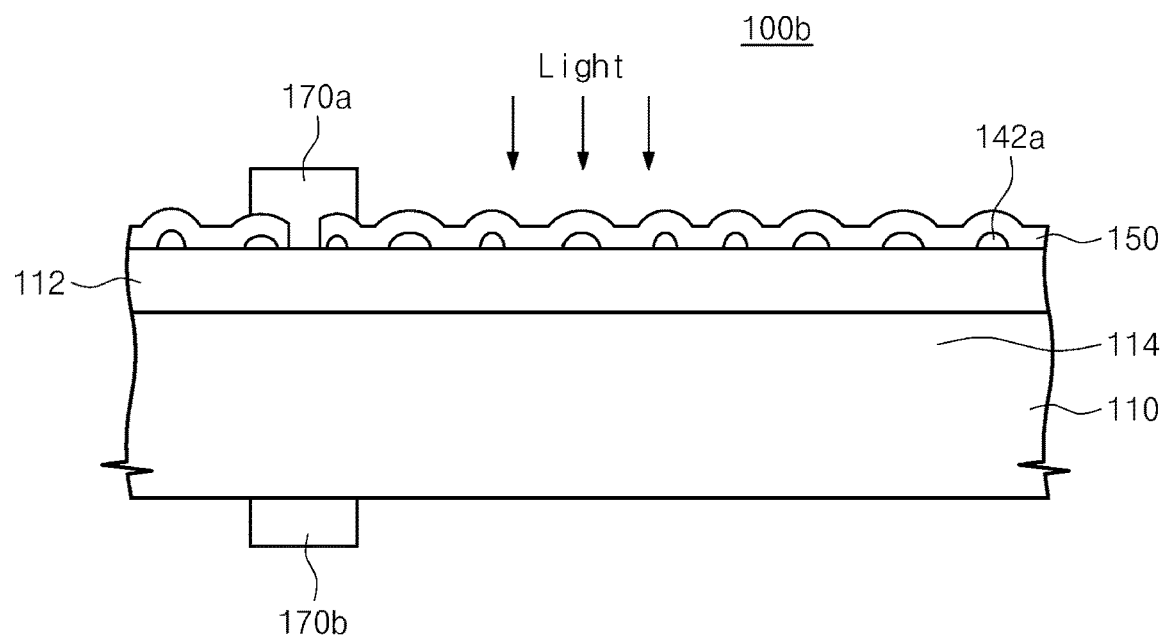
FIG. 4 is a conceptual diagram illustrating a silicon photodiode according to another embodiment of the present disclosure.

FIG. 4 is a conceptual diagram illustrating a silicon photodiode according to another embodiment of the present disclosure.

Referring to FIG. 4, a silicon photodiode 100b may include a silicon substrate 110 having a first conductive region 112 and a second conductive region 114 disposed to be vertically spaced apart from the first conductive region 112, a plurality of metal nanoparticles 142a formed on the silicon substrate 110 and arranged randomly on the first conductive region 112, an antireflective layer 150 covering the metal nanoparticles 142a, a first contact 170a penetrating through the antireflective layer 150 to be connected to the first conductive region 112, and a second contact 170b connected to the second conductive region 114.

The silicon photodiode 100b may have a vertical structure. The silicon substrate 110 is an N-type substrate and may include the second conductive region 114. The second contact 170b may be formed on a lower surface of the silicon substrate 110 or may be in contact with the second conductive region 114 after performing a MESA etching process to expose the second conductive region 114.

Figure 5:
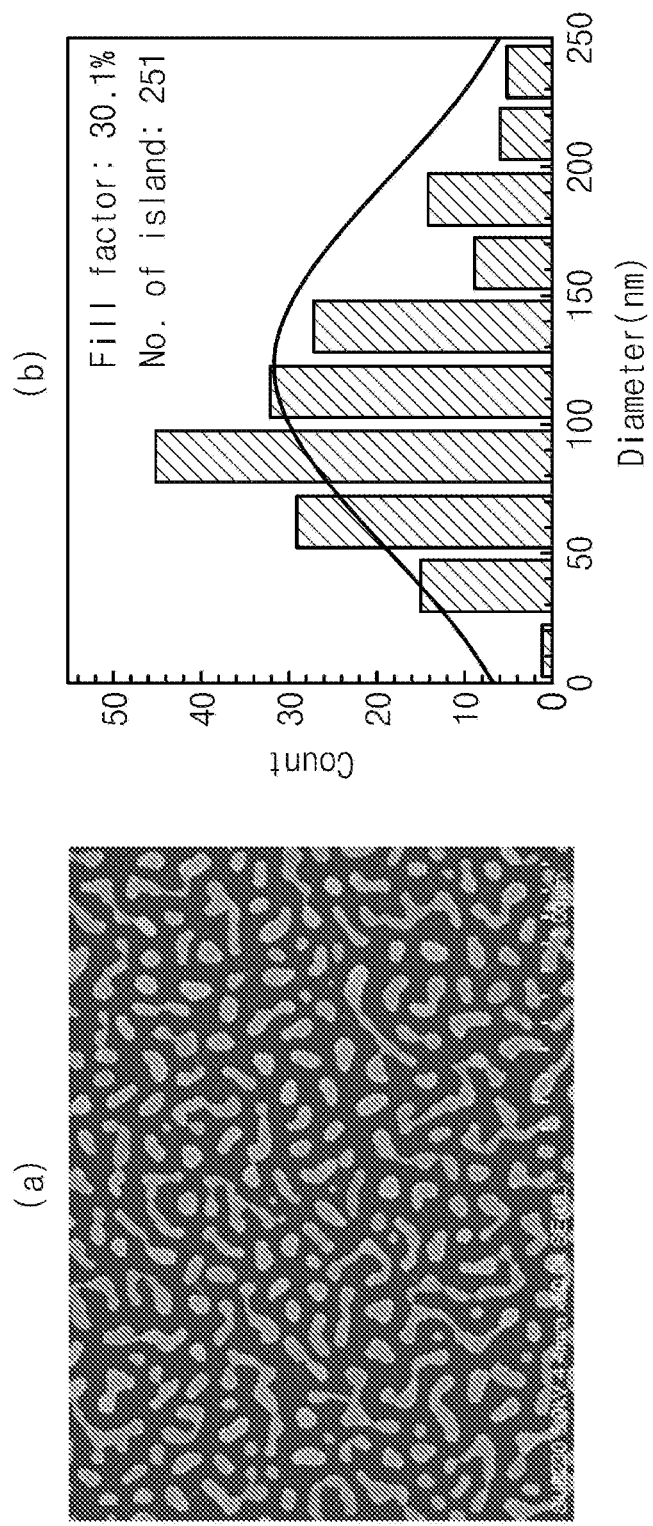
FIG. 5 is an SEM image illustrating an island-shaped metal layer according to an example embodiment of the present disclosure, and an analysis result.

FIG. 5 is a scanning electron microscope (SEM) image illustrating an island-shaped metal layer according to an example embodiment of the present disclosure, and an analysis result.

Referring to (A) of FIG. 5, (A) is a SEM image after sputtering deposition of silver (Ag) to have a target thickness of 5 nm. Islands had a randomly serpentine shape, and a fill factor was 30.1%. Referring to (B) of FIG. 5, a most frequent size is about 90 nm and ranges from several tens of nanometers to 250 nm.

Figure 6:
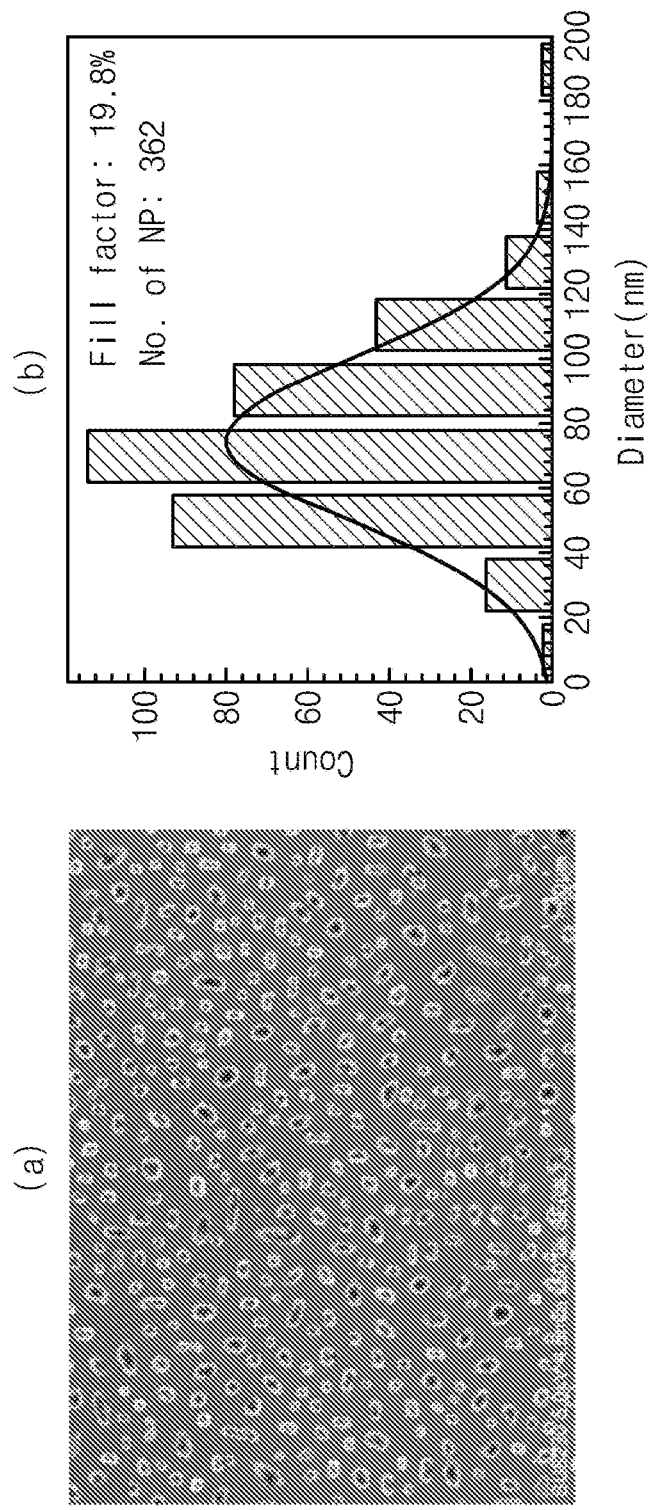
FIG. 6 is an SEM image illustrating a result of performing a vacuum heat treatment on an island-shaped metal layer at temperature of 900 degrees Celsius, and illustrates an analysis result.

FIG. 6 is an SEM image illustrating a result of performing a vacuum heat treatment on an island-shaped metal layer at temperature of 900 degrees Celsius, and illustrates an analysis result.

Referring (A) of FIG. 6, (A) is a SEM image after a thermal treatment. Islands were deformed to have a circle-like shape, and the number of particles was increased to 362. A fill factor was 19.8%. Referring to (B) of FIG. 6, a most frequent size is about 70 nm and ranges from several tens of nanometers to 160 nm. A distribution of particle sizes is close to Gaussian.

Figure 7:
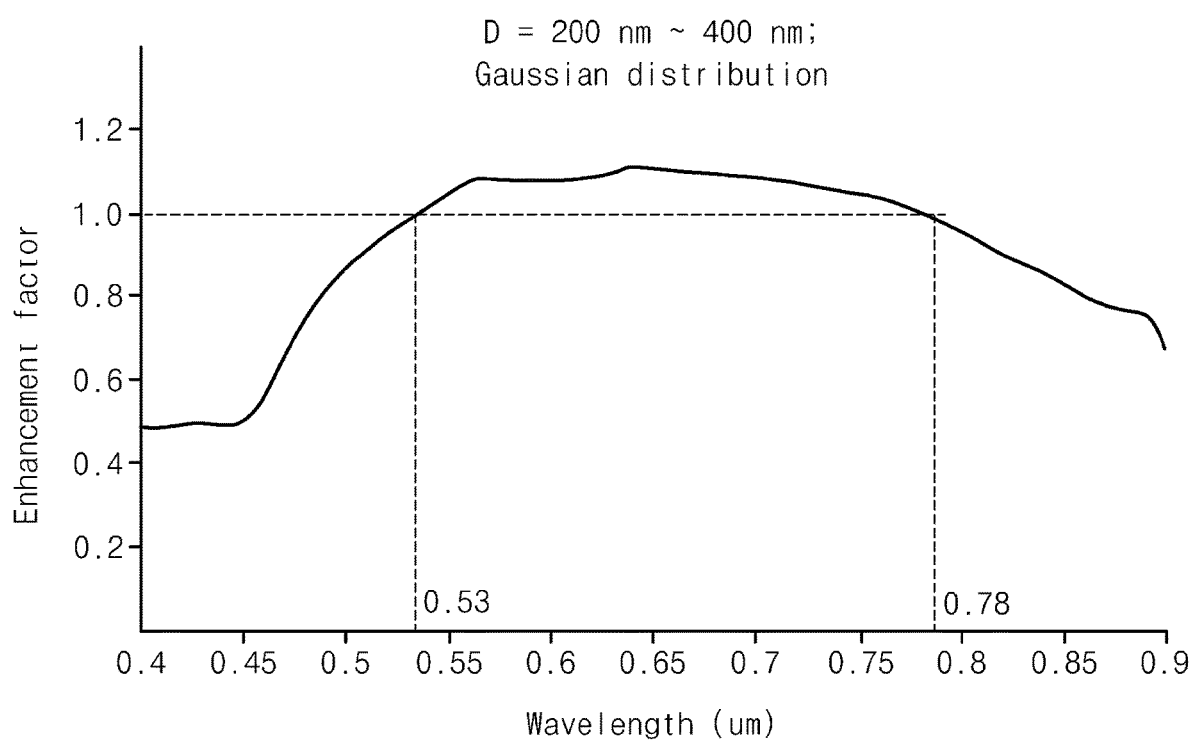
FIG. 7 is a diagram illustrating a simulation result showing an enhancement factor according to an embodiment of the present disclosure.

FIG. 7 is a diagram illustrating a simulation result showing an enhancement factor according to an embodiment of the present disclosure.

Referring to FIG. 7, when a size of a metal nanoparticle has a Gaussian distribution within a range of 200 nm to 400 nm, an enhancement factor of excitation efficiency is increased to 1 or more within a range of 0.53 um to 0.78 um in the case of presence of metal nanoparticles compared with the case of absence of metal nanoparticles. For example, when an average size of the metal nanoparticles is 300 nm, the excitation efficiency is increased in a visible light band.

Figure 8A:
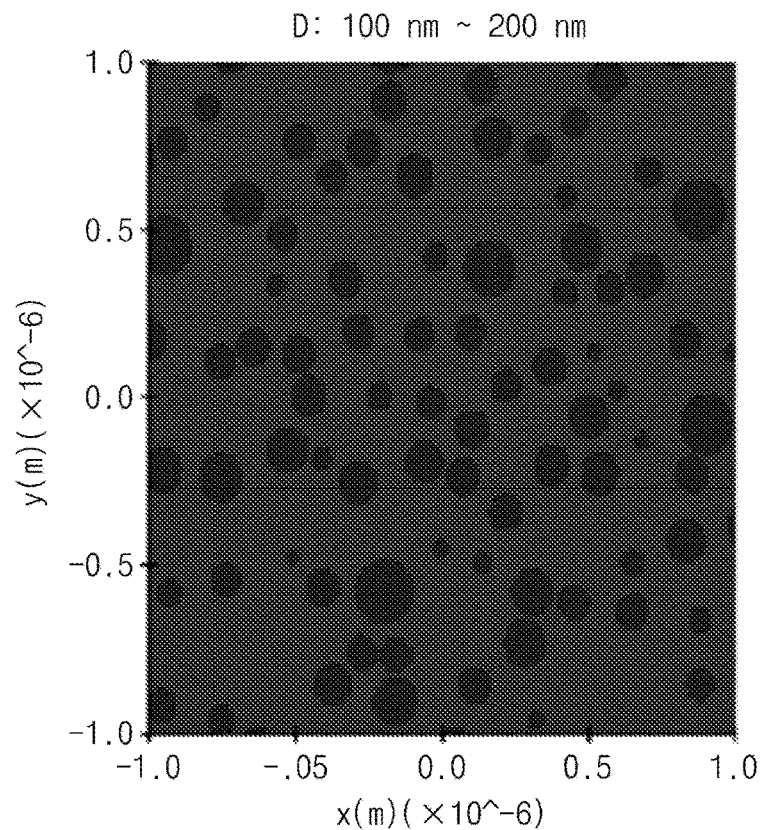
FIGS. 8A and 8B are diagrams illustrating a simulation result showing a particle distribution and an enhancement factor according to an example embodiment of the present disclosure.
Figure 8B:
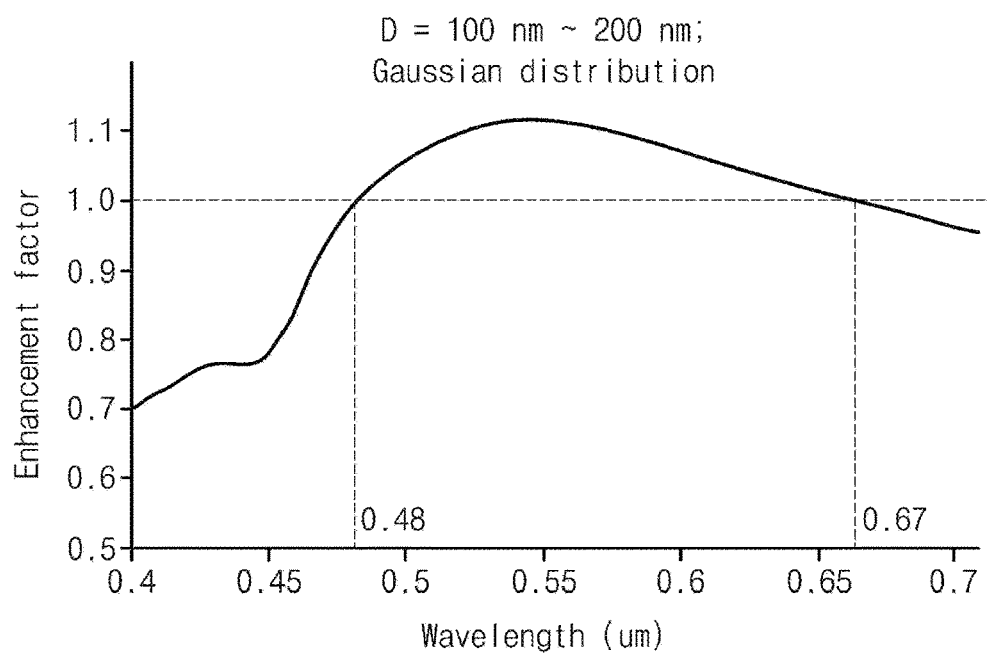

FIGS. 8A and 8B are diagrams illustrating a simulation result showing a particle distribution and an enhancement factor according to an example embodiment of the present disclosure.

Referring to FIGS. 8A and 8B, when a size of a metal nanoparticle has a Gaussian distribution within a range of 100 nm to 200 nm, an enhancement factor of excitation efficiency is increased to 1 or more within a range of 0.48 um to 0.67 um in the case of presence of metal nanoparticles compared with the case of absence of metal nanoparticles. For example, when an average size of the metal nanoparticles is 200 nm, the excitation efficiency is increased in a green band.

Figure 9A:
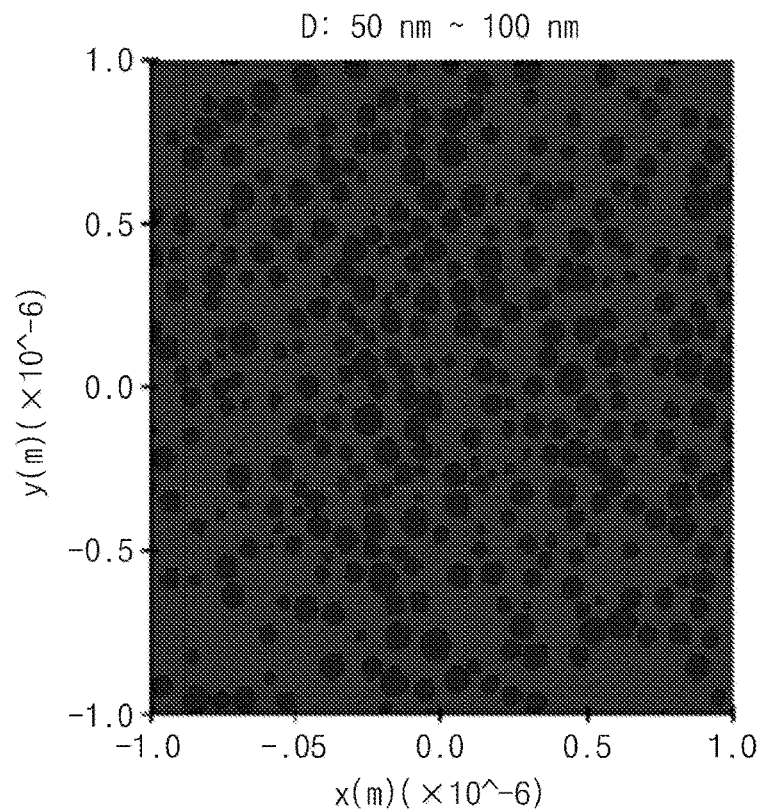
FIGS. 9A and 9B are diagrams illustrating a simulation result showing a particle distribution and an enhancement factor according to an example embodiment of the present disclosure.
Figure 9B:
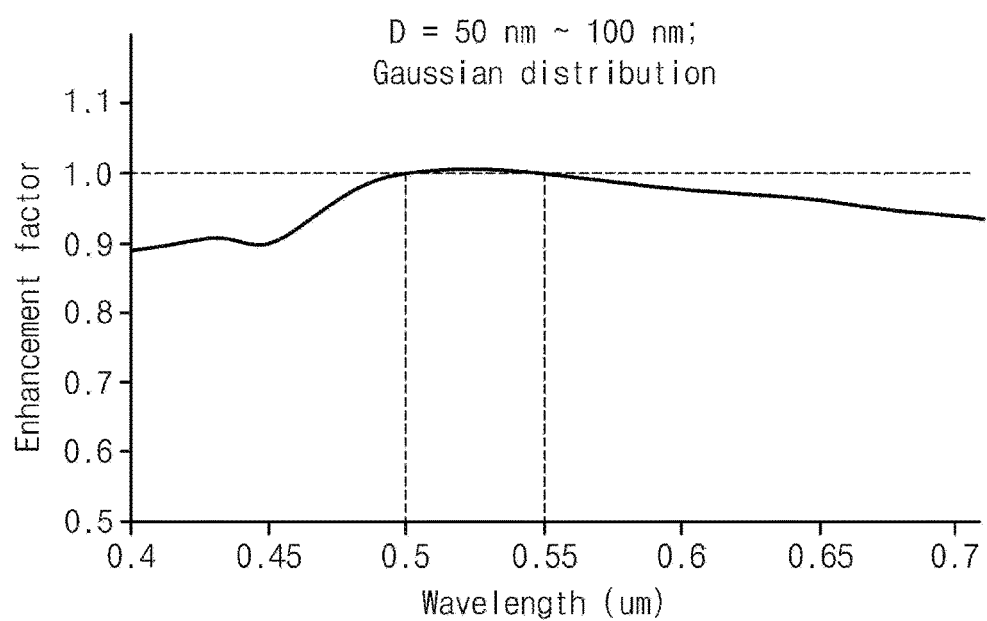

FIGS. 9A and 9B are diagrams illustrating a simulation result showing a particle distribution and an enhancement factor according to an example embodiment of the present disclosure.

Referring to FIGS. 9A and 9B, when a size of a metal nanoparticle has a Gaussian distribution within a range of 50 nm to 100 nm, an enhancement factor of excitation efficiency is increased to 1 or more within a range of 0.5 μm to 0.55 um in the case of presence of metal nanoparticles compared with the case of absence of metal nanoparticles. For example, when an average size of the metal nanoparticles is 75 nm, the excitation efficiency is increased in a green band.

As described above, a photodiode according to an example embodiment may provide high excitation efficiency in a visible light band or a green wavelength band by randomly arranged metal nanoparticles having a particle size range within a predetermined range.

A method for manufacturing a photodiode according to an example embodiment may provide hemispherical metal nanoparticles using hydrophobic characteristics of a silicon substrate by forming an island-shaped metal layer and then thermally treating the metal layer. Such nanoparticles may provide high excitation efficiency in a visible light band or a green wavelength band.

Although the present disclosure and its advantages have been described in detail, it should be understood that various changes, substitutions and alterations can be made herein without departing from the spirit and scope of the disclosure as defined by the following claims.

What is claimed is:

1. A silicon photodiode comprising:
   a silicon substrate having a first conductive region and a second conductive region disposed to be horizontally spaced apart from the first conductive region;
   a plurality of randomly arranged metal nanoparticles formed on the silicon substrate;
   an antireflective layer covering the metal nanoparticles;
   a first contact penetrating through the antireflective layer to be connected to the first conductive region; and
   a second contact penetrating through the antireflective layer to be connected to the second conductive region.

2. The silicon photodiode as set forth in claim 1, wherein the metal nanoparticles are gold or silver nanoparticles, the metal nanoparticles are hemispherical, diameters of the metal nanoparticles are distributed within a range of 100 nm to 200 nm, and a fill factor of the metal nanoparticles is 15% to 25%.

3. The silicon photodiode as set forth in claim 1, wherein the metal nanoparticles are gold or silver nanoparticles, the metal nanoparticles are hemispherical, diameters of the metal nanoparticles are distributed within a range of 200 nm to 400 nm, and a fill factor of the metal nanoparticles is 15% to 25%.

4. The silicon photodiode as set forth in claim 1, wherein the first conductive region and the second conductive region are formed to be in contact with one surface of the semiconductor substrate, and the silicon photodiode further comprises an intrinsic region disposed between the first conductive region and the second conductive region.

5. A method for manufacturing a silicon photodiode, the method comprising:
   forming a buffer layer on a silicon substrate;
   forming a first photoresist pattern on the silicon substrate on which the buffer layer is formed, and then implanting impurities of a first conductivity type to form a first conductive region;
   forming a second photoresist pattern to be spaced apart from the first conductive region on the silicon substrate, on which the buffer layer is formed, and the implanting impurities of a second conductivity type to form a second conductive region;
   removing the buffer layer from the silicon substrate, on which the first conductive region and the second conductive region are formed, with a hydrophobic solution;
   depositing an island-shaped metal layer on the silicon substrate from which the buffer layer is removed;
   thermally treating the silicon substrate, on which the metal layer is deposited, to convert the metal layer into metal nanoparticles;
   forming an antireflective layer on the silicon substrate to cover the metal nanoparticles; and
   forming a first contact, penetrating through the antireflective layer to be connected to the first conductive region, and a second contact penetrating through the antireflective layer to be connected to the second conductive region.

6. The method as set forth in claim 5, wherein
the thermal treatment is performed in vacuum or $N_2$ atmosphere at temperature lower than or equal to a melting point of the metal layer,
the thermal treatment has a low melting point due to characteristics of an island-shaped metal layer, and
the thermal treatment is performed at temperature T within a range of 100 degrees Celsius (Tc-100), equal to or less than a melting temperature Tc of the metal layer, to the melting temperature Tc.

7. The method as set forth in claim 5, wherein
the thermal treatment is performed at a temperature of 900 degrees Celsius for several minutes to several tens of minutes when the metal layer includes silver.

8. The method as set forth in claim 5, wherein
the metal layer is deposited using a sputtering method,
the metal layer has a thickness of several nanometers to several tens of nanometers, and
the metal layer is deposited to have an island shape.

9. The method as set forth in claim 5, wherein
the metal nanoparticles are gold or silver nanoparticles,
the metal nanoparticles are hemispherical,
diameters of the metal nanoparticles are distributed within a range of 100 nm to 200 nm, and
a fill factor of the metal nanoparticles is 15% to 25%.

10. The method as set forth in claim 5, wherein
the metal nanoparticles are gold or silver nanoparticles,
the metal nanoparticles are hemispherical,
diameters of the metal nanoparticles are distributed within a range of 200 nm to 400 nm, and
a fill factor of the metal nanoparticles is 15% to 25%.

11. A silicon photodiode comprising:
a silicon substrate having a first conductive region and a second conductive region disposed to be vertically spaced apart from the first conductive region;
a plurality of metal nanoparticles formed on the silicon substrate and arranged randomly on the first conductive region;
an antireflective layer covering the metal nanoparticles;
a first contact penetrating through the antireflective layer to be connected to the first conductive region; and
a second contact connected to the second conductive region.

* * * * *